(12) United States Patent
Hobbs et al.

(10) Patent No.: US 6,171,910 B1
(45) Date of Patent: Jan. 9, 2001

(54) METHOD FOR FORMING A SEMICONDUCTOR DEVICE

(75) Inventors: Christopher C. Hobbs; Bikas Maiti; Wei Wu, all of Austin, TX (US)

(73) Assignee: Motorola Inc., Schaumburg, IL (US)

( * ) Notice: Under 35 U.S.C. 154(b), the term of this patent shall be extended for 0 days.

(21) Appl. No.: 09/358,213

(22) Filed: Jul. 21, 1999

(51) Int. Cl.$^7$ .................................................. H01L 21/336
(52) U.S. Cl. ........................ 438/275; 438/195; 438/197; 438/585
(58) Field of Search .................................. 438/197, 198, 438/275, 926, 195, 585, FOR 193

(56) References Cited

U.S. PATENT DOCUMENTS

| | | | |
|---|---|---|---|
| 4,807,007 | * | 2/1989 | Borrello et al. . |
| 4,984,042 | | 1/1991 | Pfiester et al. ........................ 357/23.9 |
| 5,200,352 | | 4/1993 | Pfiester ................................. 437/44 |
| 5,391,510 | * | 2/1995 | Hsu et al. . |
| 5,532,181 | * | 7/1996 | Takebuchi et al. . |
| 5,668,035 | * | 9/1997 | Fang et al. . |
| 5,904,508 | * | 5/1999 | Codama et al. . |
| 6,033,958 | * | 3/2000 | Chou et al. . |
| 6,037,201 | * | 3/2000 | Tsai et al. . |
| 6,037,222 | * | 3/2000 | Huang et al. . |
| 6,040,222 | * | 3/2000 | Hsu et al. . |
| 6,040,610 | * | 3/2000 | Noguchi et al. . |

* cited by examiner

*Primary Examiner*—George Fourson
*Assistant Examiner*—Joannie Adelle Garcia
(74) *Attorney, Agent, or Firm*—Robert A. Rodriguez

(57) ABSTRACT

First and second dummy structures (201 and 202) are formed over a semiconductor device substrate (10). In one embodiment, portions of the first dummy structure (201) are removed and replaced with a first conductive material (64) to form a first gate electrode (71) and portions of second dummy structure (202) are removed and replaced with a second conductive material (84) to form a second gate electrode (91). In an alternate embodiment, the dummy structures (201 and 202) are formed using a first conductive material (164) that is used to form the first electrode (71). The second electrode is then formed by removing the first conductive material (164) from dummy structures (202) and replacing it with a second conductive material (84). In accordance with embodiments of the present invention, the first conductive material and the second conductive material are different conductive materials.

16 Claims, 4 Drawing Sheets

US 6,171,910 B1

METHOD FOR FORMING A SEMICONDUCTOR DEVICE

RELATED APPLICATIONS

This application is related to U.S. patent application Ser. No. 08/907,990, now U.S. Pat. No. 5,960,270, entitled "Method for Forming an MOS Transistor Having a Metallic Gate Electrode that is Formed After the Formation of Self-aligned Source and Drain Regions" filed Aug. 11, 1997; U.S. patent application Ser. No. 09/107,963, now U.S. Pat. No. 6,027,961, entitled "CMOS Semiconductor Devices and Method of Formation" filed on Jun. 30, 1998, and Attorney Docket Number SC91178A, entitled "Method for Forming A Semiconductor Device" filed of even date, all of which are assigned to the current assignee hereof and are hereby incorporated by reference.

FIELD OF THE INVENTION

The present invention relates generally to methods for forming semiconductor devices and more particularly to methods for forming semiconductor devices including gate electrodes.

BACKGROUND OF THE INVENTION

In semiconductor device fabrication, polysilicon and silicon dioxide are commonly used to form gate electrodes and gate dielectrics for metal-oxide-semiconductor (MOS) transistors. However, the scaling of semiconductor devices into the 0.1 micron ($\mu$m) regime will likely result in problems that will require fabricating gate electrodes and gate dielectrics using alternative materials.

Polysilicon requires the addition of impurities to affect its conductivity. As the transistor is scaled to smaller dimensions, the transistor's resistivity is increased and gate depletion effects can become a factor. Increasing the impurity concentration within the polysilicon to reduce the resistance and the gate depletion effects can contribute to boron penetration effects, which can adversely affect the transistor's performance. In addition, scaling may also necessitate using alternative dielectric materials, such as metal oxides that have dielectric constants greater than that of conventional silicon dioxide in order to reduce tunneling leakage between the gate electrode and the transistor's channel region. Incompatibility issues can exist when using polysilicon gates in conjunction with some metal oxides. The polysilicon can react with the metal oxide and contaminate it, thereby negatively affecting its dielectric constant properties.

Metals are an alternative material currently being investigated to replace polysilicon for use as gate electrodes. Metals offer potential advantages over polysilicon because of their low sheet resistance. However, merging metal gate technology into complementary MOS (CMOS) designs introduces new process integration and manufacturing issues. For example, current polysilicon gate CMOS processes can use a combination of doped $N^+$ and $P^+$ polysilicon in respective NMOS and PMOS devices to overcome problems associated with adjusting channel threshold voltages (VT). Metals, however, are not readily doped. Therefore, when replacing polysilicon with metal, efforts have focused on selecting those metals having work functions that are close to the mid band-gap of silicon. This allows the VT of the respective n-channel and p-channel devices to be symmetrical. Unfortunately, these mid-gap metal materials can result in transistor VTs that are not optimized for low-voltage, low-power, high-performance devices.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

In accordance with an embodiment of the present invention, dummy structures are formed over a semiconductor device substrate. Portions of a first dummy structure are removed and replaced with a first conductive material that is used to form a first gate electrode and portions of a second dummy structure are removed and replaced with a second conductive material that is used to form a second gate electrode. In an alternative embodiment, the dummy structures are formed using a first conductive material that is used to form a first electrode. A second electrode is then formed by removing the first conductive material from at least one of the dummy structures and replacing it with a second conductive material. In accordance with embodiments of the present invention, the first conductive material and the second conductive material include at least one different conductive material.

Figure 1:
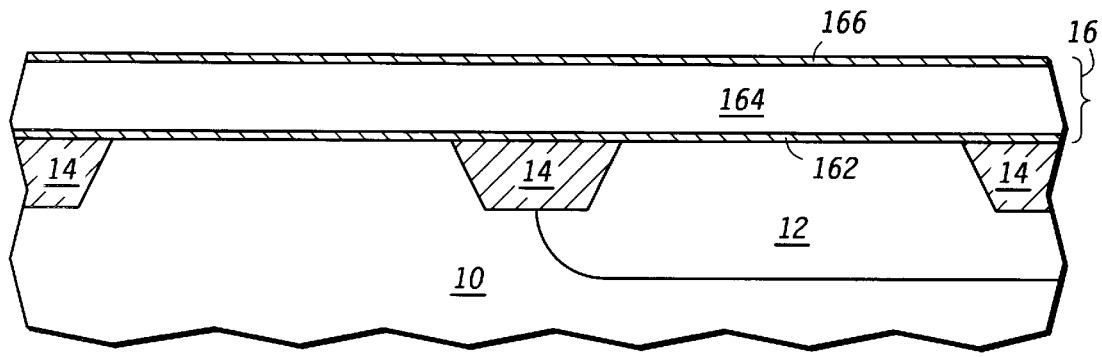
FIG. 1 includes an illustration of a cross-sectional view of a portion of a semiconductor device substrate after forming a dummy stack.

An embodiment of the present invention will now be described more fully with references to the accompanying figures. Shown in FIG. 1 is a cross-sectional view of a partially formed semiconductor device. The semiconductor device comprises a p-type semiconductor device substrate 10, an N-well region 12, field isolation regions 14, and a dummy film stack 16. In this particular embodiment, semiconductor device substrate 10 is a monocrystalline semiconductor substrate. Alternatively, semiconductor device substrate 10 is a semiconductor-on-insulator substrate or any other substrate used for forming semiconductor devices. Field isolation regions 14 are shallow trench isolation regions formed using conventional etch and chemical-mechanical polishing (CMP) processes. Alternatively, field isolation regions 14 can be formed using local oxidation of silicon (LOCOS) or any other technique used for forming isolation regions. After forming the isolation regions 14, well regions 12 are formed in the semiconductor device substrate 10. For simplicity of illustration, in this particular embodiment, only a single well region 12 is shown.

After forming the well region 12, the dummy film stack 16 is formed over the semiconductor device substrate 10. In this particular embodiment, dummy film stack 16 includes a dielectric layer 162, a polysilicon layer 164, and an antireflective layer 166. The dielectric layer 162 can be formed by thermally oxidizing portions of the substrate 10. Alternatively, the dielectric layer can be formed as a layer of silicon nitride, silicon oxynitride, silicon oxide, or the like, using other deposition methods, such as low pressure chemical vapor deposition (LPCVD), plasma enhanced chemical vapor deposition (PECVD), or the like. The thickness of the dielectric layer 162 is typically in a range of approximately 5–25 nanometers (nm). The Polysilicon layer 164 is typically formed using conventional LPCVD methods. The polysilicon layer 164 can alternatively be formed as a layer of amorphous silicon, silicon germanium, or any other material that can be selectively etched with respect to materials, such as silicon nitride and oxide. The thickness of the polysilicon layer 164 is typically in a range of approximately 50–300 nm. However, those of ordinary skill in the art will appreciate, after reviewing embodiments herein, that the thickness of the polysilicon layer 164 can vary according to the desired thickness of subsequently formed gate electrodes. The antireflective layer 166 can be formed as a layer of silicon-rich silicon nitride or, alternatively, any other material capable of being used as an antireflective coating (ARC) layer. Its method of formation and thickness are conventional.

Figure 2:
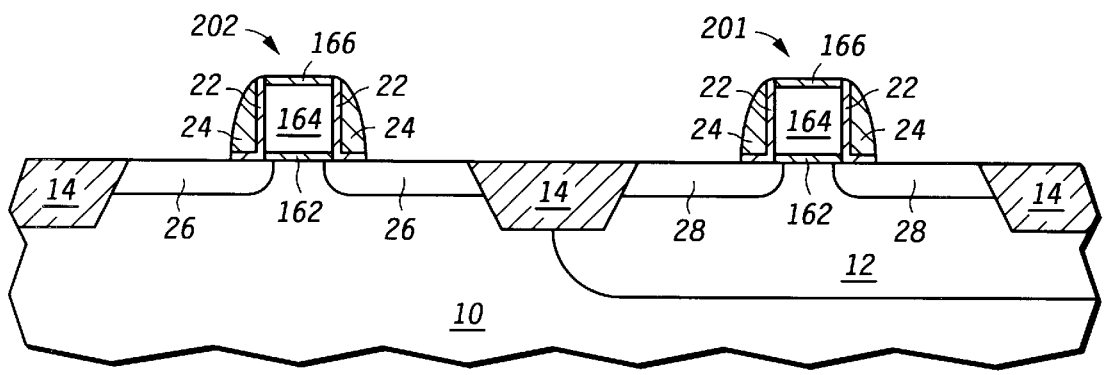
FIG. 2 includes an illustration of a cross-sectional view of the substrate of FIG. 1 after forming dummy structures and extension implants within the substrate.

The dummy film stack 16 is then patterned and etched using conventional reactive ion etch (RIE) processing to form dummy structures 201 and 202 that include remaining portions of dielectric layer 162, polysilicon layer 164, and antireflective layer 166. The dummy structures 201 and 202 are further processed, using conventional techniques, to include a liner layer 22, n-type extension regions 26, p-type extension regions 28, and sidewall spacers 24, as illustrated in FIG. 2.

Figure 3:
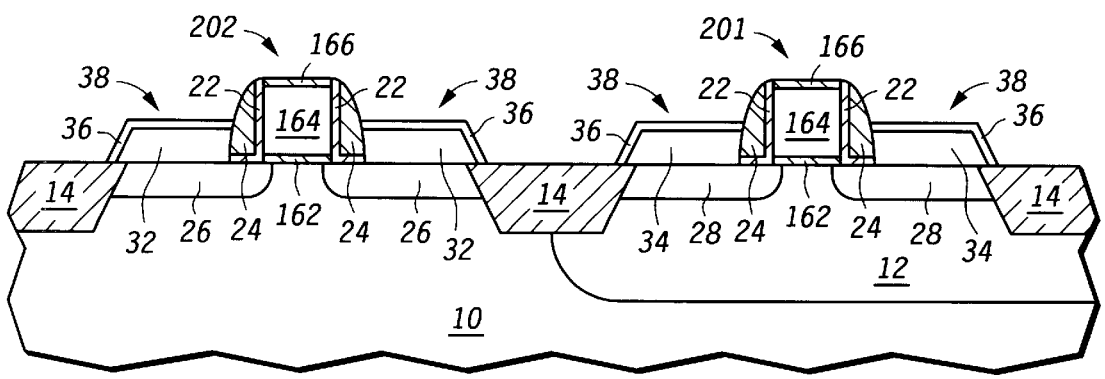
FIG. 3 includes an illustration of a cross-sectional view of the substrate of FIG. 2 after forming elevated source/drain regions.

In FIG. 3, an epitaxial layer 38 is formed over extension regions 26 and 28. In one particular embodiment, the epitaxial layer 38 is formed using selective epitaxial deposition. The epitaxial layer 38 can be formed using materials that include silicon, germanium, silicon-germanium, or the like. Portions of the epitaxial layer 38 are then doped to form elevated N-type source and drain regions 32 and elevated P-type source and drain regions 34 for the N-channel and P-channel transistors, respectively. After forming the elevated source and drain regions 32 and 34, a metal layer can be deposited over the surface of the substrate 10. The metal layer can be used to form a silicide layer 36 overlying the source and drain regions 32 and 34. In this particular embodiment, the silicide layer is a cobalt silicide layer. Alternatively, silicide layer 36 can be formed using other metal materials suitable for forming silicides, such as titanium, tantalum, tungsten, platinum, palladium, and the like.

Figure 4:
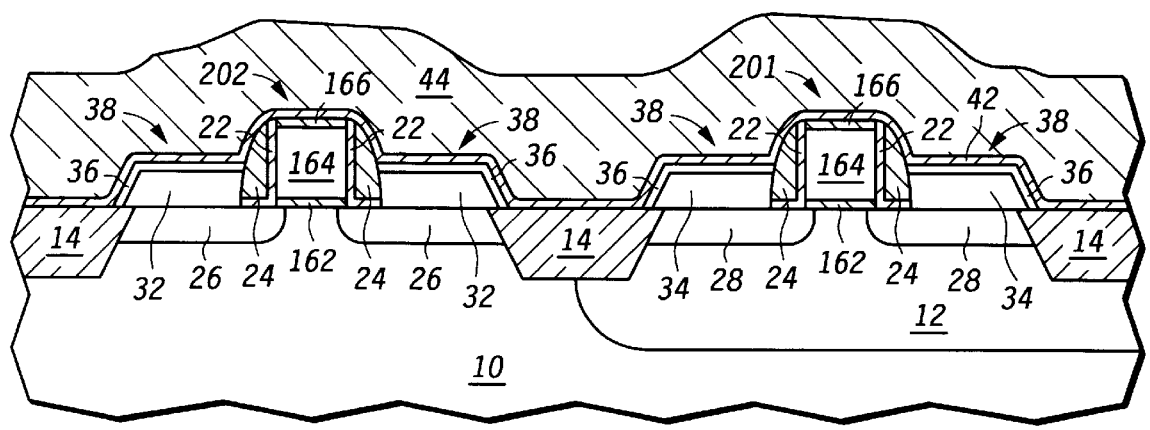
FIG. 4 includes an illustration of a cross-sectional view of the substrate of FIG. 3 after forming an insulating layer over the substrate.

FIG. 4 illustrates the semiconductor device substrate of FIG. 3 and now further includes a capping layer 42 and an insulating layer 44 overlying the substrate 10. In one particular embodiment, capping layer 42 is a layer of plasma enhanced nitride (PEN). In other embodiments, the capping layer 42 can alternatively include materials, such as silicon oxynitride, titanium oxide, and tantalum oxide. The insulating layer 44 is formed over the capping layer 42 and can be formed as a layer of CVD or furnace deposited silicon oxide that uses tetraethylorthosilicate (TEOS) as a reactant gas. Alternatively, insulating layer 44 can be formed using other materials, such as phosphosilicate glass (PSG), borophosphosilicate glass (BPSG), silicon oxynitride, polyimide, a low-k dielectric, or a combination thereof. For the purposes of this specification, a low-k dielectric is a material having dielectric constant less than approximately 3.5.

Figure 5:
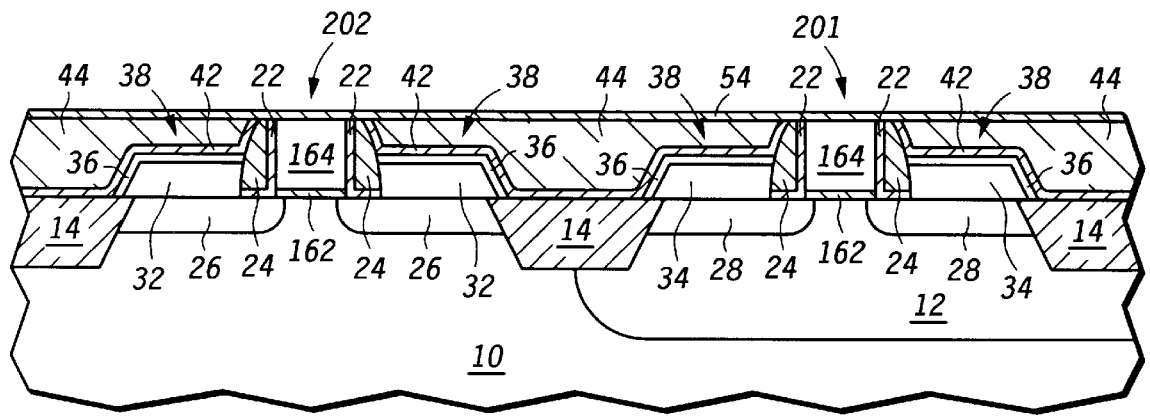
FIG. 5 includes an illustration of a cross-sectional view of the substrate of FIG. 4 after polishing the substrate and capping an exposed surface of the substrate.

In FIG. 5, a chemical-mechanical polishing process is used to remove portions of insulating layer 44 and planarize the surface of the substrate 10. In one embodiment, the polysilicon layer 164 functions as a polishing stop layer during the polishing process. The polishing process removes portions of the insulating layer 44, capping layer 42, and ARC layer 166 and exposes portions of the polysilicon layer 164 within dummy structures 201 and 202. In this embodiment, over-polishing may preferentially be performed to insure adequate exposure of the upper surface of the polysilicon layer 164. A capping layer 54 is then formed over the planarized surface as shown in FIG. 5. In this particular embodiment, the capping layer 54 is a layer of silicon nitride formed using conventional LPCVD processing. Alternatively, the capping layer 54 may also be formed as a silicon nitride layer using a PECVD process. The thickness of nitride capping layer 54 is typically in a range of approximately 5–200 nanometers (nm), and often the thickness of the capping layer is in a range of 5–50 nm.

Figure 6:
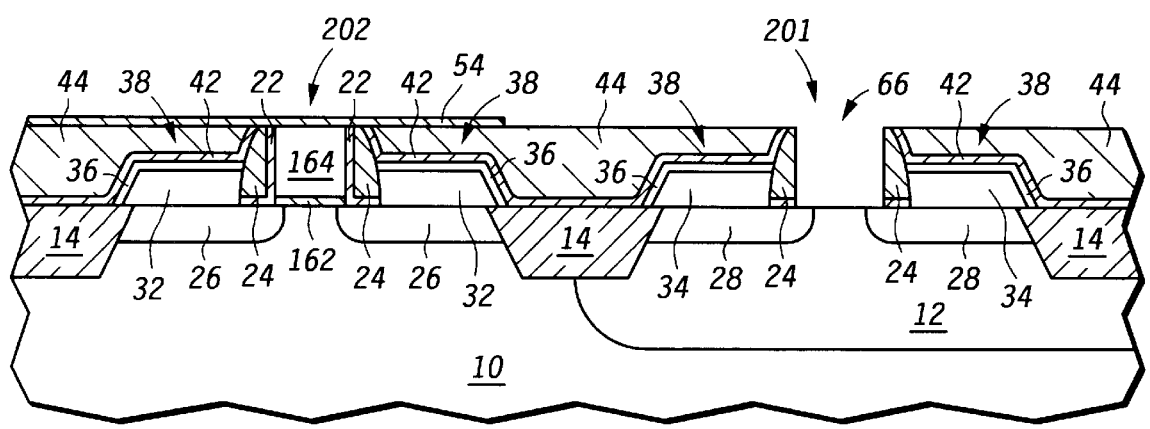
FIG. 6 includes an illustration of a cross-sectional view of the substrate of FIG. 5 after removing portions of one of the dummy structures.

FIG. 6 illustrates that portions of capping layer 54, polysilicon layer 164, dielectric layer 162, and liner layer 22 associated with dummy structure 201 have been removed. During this processing, remaining portions of the capping layer 54 protect underlying regions associated with dummy structure 202. Removal of portions of the dummy structure 201 is accomplished using conventional photolithography and reactive ion etch (RIE) As processes to first remove portions of the capping layer 54 associated with the dummy structure 201, thereby exposing the polysilicon layer 164. The exposed portions of polysilicon layer 164 are then removed using conventional plasma or wet etching processes to define a feature opening 66, as shown in FIG. 6. If so desired, an ion implant threshold (VT) adjust is then optionally performed through the feature opening 66 and portions of the dielectric layer 162 and liner layer 22 are optionally removed using conventional dielectric etch processing.

Figure 7:
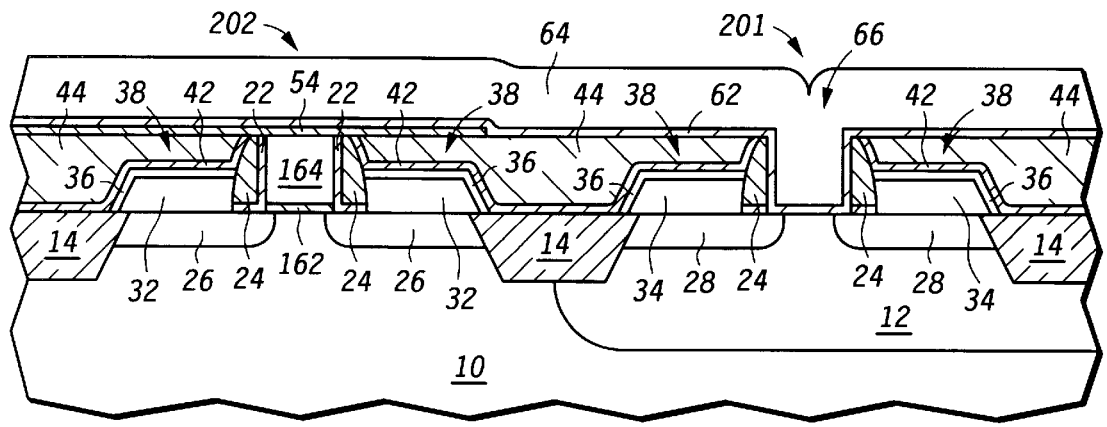
FIG. 7 includes an illustration of a cross-sectional view of the substrate of FIG. 6 after depositing a first gate dielectric material and first gate electrode material.

In accordance with one embodiment, the dielectric layer 162 and portions of the liner layer 22 are removed and replaced with a gate dielectric layer 62, as shown in FIG. 7. In alternative embodiments where the dielectric layer 162 and the liner layer 22 are formed using dissimilar materials, the dielectric layer 162 can be selectively removed with respect to the liner layer 22 and replaced with a gate dielectric layer 62. In this particular embodiment, the gate dielectric layer 62 is a layer of thermally deposited silicon dioxide. The thickness of the gate dielectric layer 62 is typically in a range of approximately 5–20 nanometers, however, those of ordinary skill in the art appreciates that this thickness can vary according to the operational requirements of the semiconductor device. Alternatively, the gate dielectric layer 62 can be formed using other materials, such as silicon nitride, (Si3N4) titanium dioxide (TiO2), tantalum pentoxide (Ta2O5), strontium titanate (STO), barium strontium titanate (BST), lead zirconate titanate (PZT), or the like.

A gate electrode material 64 is then formed within the feature opening 66. The gate electrode material is typically formed using conventional CVD, PVD or plating processes. As shown in FIG. 7, the thickness of gate electrode material 64 should be such that it substantially fills the feature opening 66. The gate electrode material 64 is preferably a metal or metal nitride. More specifically, the gate electrode material 64 can be formed using a material such as aluminum (Al), titanium (Ti), titanium nitride (TiN), tantalum (Ta), tantalum nitride (TaN), tungsten (W), tungsten nitride (WN), molybdenum (Mo), molybdenum nitride (MoN), copper (Cu), and the like. Other materials that can be used as the gate electrode material 64 include noble metals and metals that are capable of forming conductive metal oxides. Examples of these include platinum (Pt), palladium (Pd), osmium (Os), ruthenium (Ru), iridium oxide (IrO$_2$), ruthenium oxide (ReO$_2$, ReO$_3$), and the like. In addition, a combination of the foregoing materials can be used as the gate electrode material 64.

Figure 8:
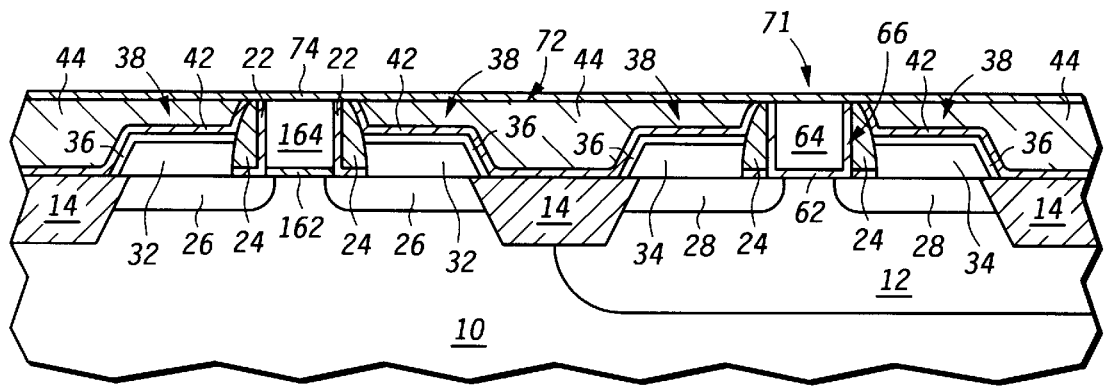
FIG. 8 includes an illustration of a cross-sectional view of the substrate of FIG. 7 after polishing the substrate and forming a capping layer over a first gate electrode.

In FIG. 8, portions of the gate electrode material 64, gate dielectric layer 62, and nitride capping layer 54 are removed using a conventional polishing to form a metal gate electrode 71. The dimensions and location of the metal gate electrode 71 are substantially the same as those previously defined by the polysilicon layer 164 in dummy structure 201. As illustrated in FIG. 8, the surface 72 is substantially planar as a result of the polishing process to define gate electrode 71. A capping layer 74 is then formed over the surface 72. In this particular embodiment, the capping layer 74 is formed using processes and materials similar to those described previously to form the capping layer 54. Alternatively, in embodiments where oxidation is of concern, the capping layer 74 can be formed using rapid thermal CVD (RTCVD) process to minimize the oxidation of exposed portions of the first gate electrode material 64. The thickness of nitride capping layer 74 is typically in a range of approximately 5–200 nanometers (nm), often the thickness of the nitride capping layer in a range of 5–50 nm. The nitride capping layer 74 can be formed using conventional deposition processes.

Figure 9:
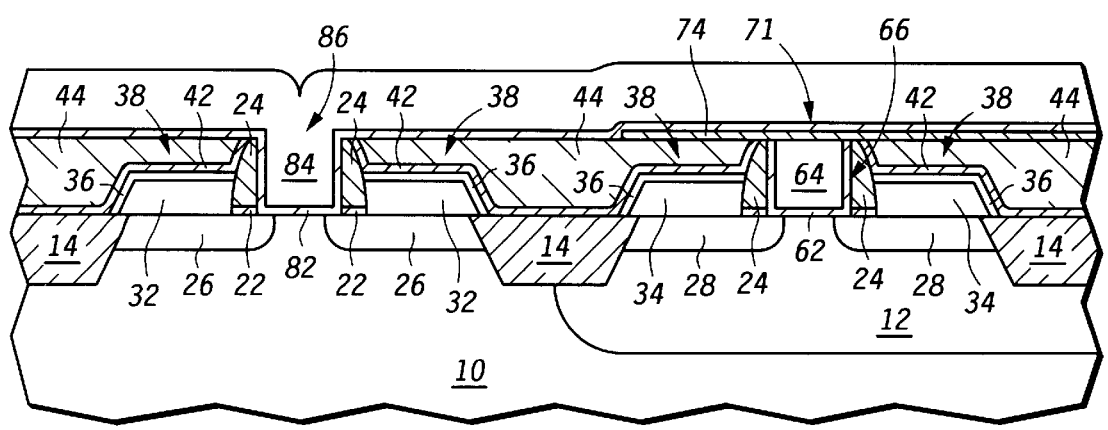
FIG. 9 includes an illustration of a cross-sectional view of the substrate of FIG. 8 after depositing a second gate dielectric material and second gate electrode material.

In FIG. 9, portions of capping layer 74, polysilicon layer 164, dielectric layer 162, and the liner layer 22, associated with dummy structure 202, have been removed and replaced with a gate dielectric layer 82 and a gate electrode material 84. If so desired, an ion implant threshold (VT) adjust can be performed during this processing sequence. The removal of capping layer 74, polysilicon layer 164, dielectric layer 162, and liner layer 22 is performed in a manner similar to that described previously in FIG. 6 to remove the nitride capping layer 54, polysilicon layer 164, dielectric layer 162, and liner layer 22. Additionally, the deposition and materials used to form the gate dielectric layer 82 and the gate electrode material 84 are similar to those used to form the gate dielectric layer 62 and gate electrode material 64, described previously in FIG. 6. Typically, however, the combination of materials or thicknesses used to form the gate structure from dielectric layer 82 and gate electrode material 84 is selected such that the VT or some other electrical parameter is different from that of the gate structure formed from the gate dielectric layer 62 and gate electrode material 64.

Figure 10:
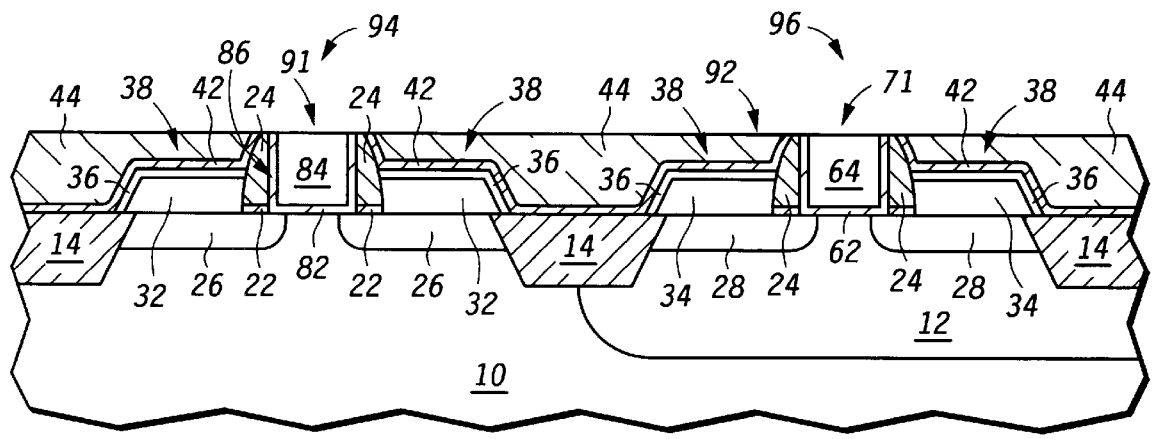
FIG. 10 includes an illustration of a cross-sectional view of the substrate of FIG. 9 after forming N-channel and P-channel transistors.

FIG. 10 shows that the gate electrode material 84, gate dielectric layer 82, and nitride capping layer 74 have been removed, using conventional polishing processing to form a metal gate 91 within the feature opening 86. Upon completion of this processing step, N-channel and P-channel transistors 94 and 96 have been substantially formed.

Figure 11:
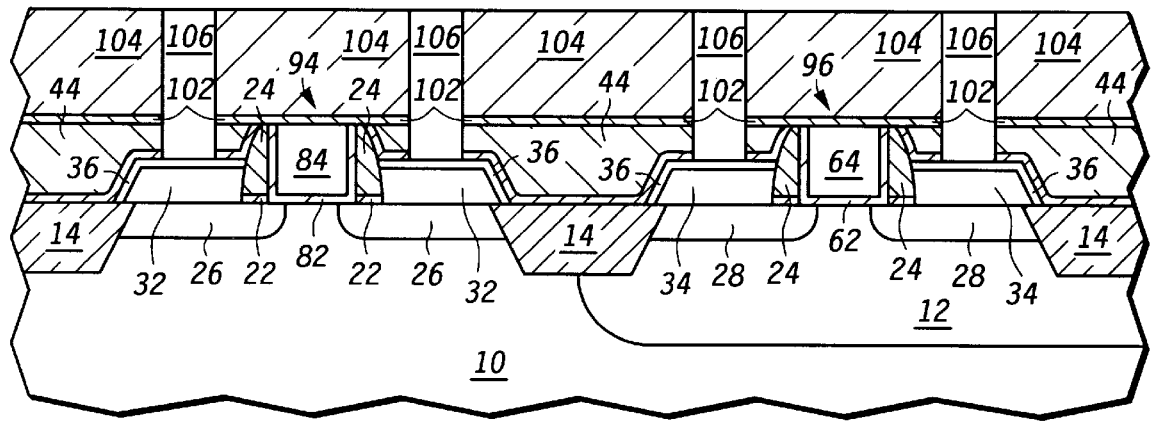
FIG. 11 includes a cross-sectional view of the substrate of FIG. 10 after forming conductive plugs.

FIG. 11 illustrates the semiconductor device substrate of FIG. 10, and further shows a nitride capping layer 102, an interlevel dielectric layer (ILD) 104, and conductive plugs 106 formed over the substrate 10. The nitride capping layer 102 and the interlevel dielectric layer (ILD) 104 are formed using conventional materials and processes. In one specific embodiment, the ILD layer 104 is polished, patterned and etched to form openings that expose the salicide regions 36 associated with source and drain regions 32 and 34, as illustrated in FIG. 11. Although not shown, the openings may alternatively be formed to expose various combinations of the source and drain regions or to one or more of the gate electrodes 71 and 91. After forming the openings, conductive plugs 106 are then formed within the openings using conventional deposition and polishing processes.

Figure 12:
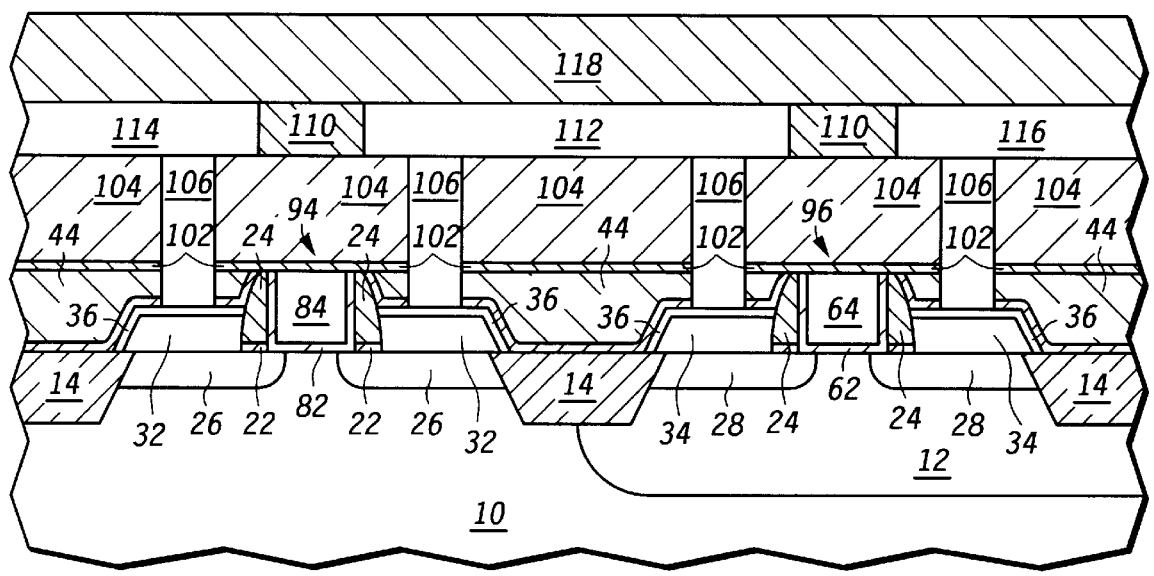
FIG. 12 includes a cross-sectional view of the substrate of FIG. 11 after forming a substantially completed device.

Processing continues to form a substantially completed semiconductor device, as shown in FIG. 12. An insulating layer 110 is formed and patterned to define interconnect trenches. The inlaid interconnects 112, 114, and 116 are then formed using a combination of deposition and polish processes. In this particular embodiment, interconnect 112 is the output of an inverter and is connected to the drain regions of the transistors 94 and 96. Interconnect 114 is connected to a $V_{SS}$ electrode (not shown) and to the source region of the transistor 94. Interconnect 116 is connected to a $V_{DD}$ electrode (not shown) and to the source region of the transistor 96. A common connection (not shown) to the gate electrodes for transistors 94 and 96 provides the input to the inverter. Although not shown in FIG. 12, other electrical connections, insulating layers, and interconnect levels can be incorporated to form additional device circuitry.

The present invention includes many other alternative embodiments. In one embodiment, selected portions of polysilicon film 164 can be implanted to change its molecular composition. For example, the P-channel dummy structures can implanted with germanium, at a doping level of at least approximately 1E15 ions per square centimeter, to form a germanium-doped polysilicon film. The compositional differences between the polysilicon and the germanium-doped polysilicon film now make it possible to selectively etch the dummy structures relative to each other and remove either the polysilicon or germanium-doped polysilicon material. Therefore, the capping layer 74 shown in FIG. 8 may not be necessary. Benefits of this embodiment include requiring fewer deposition and patterning steps to form the dummy structure and subsequent gate electrode.

In an alternative embodiment, the capping layer 42, in FIG. 4, is the polish stop layer instead of the polysilicon layer. In this embodiment, the capping/polish stop layer is formed using a dielectric material that can include silicon nitride, titanium oxide, tantalum oxide, aluminum oxide, zirconium oxide, germanium nitride, aluminum nitride, or the like. The thickness of the capping/polishing stop layer is typically in a range of approximately 20–100 nm. If silicide regions have been formed, such as suicide regions 36, a thin silicon oxide or silicon nitride layer may be formed between the capping/polishing stop layer and the silicide regions to minimize interactions between the two materials. In this embodiment, the polishing process first exposes portions of the capping/polishing stop layer defined by remaining adjacent portions of the insulating layer, such as insulating layer 44. The substrate is then patterned and etched or, alternatively, selectively etched with respect to the remaining adjacent portions of the insulating layer, to remove the exposed portions of the capping/polishing stop layer, underlying portions of the ARC layer 166, polysilicon layer 164, dielectric layer 162, and liner layer 22 within the dummy structure, thereby forming an opening similar to opening 66, shown in FIG. 6. A gate dielectric layer and gate electrode material are then formed within the opening similar to the gate dielectric layer 62 and gate electrode material 64 described and shown in FIG. 7. The substrate is then polished to form a first gate electrode similar to gate electrode 71 described and shown in FIG. 7.

During polishing to remove the gate electrode material and gate dielectric layer that forms the first gate electrode, the capping/polishing stop layer can again be used as a polishing stop for the formation of additional gate electrodes. For example, after polishing to at least partially define the first electrode and expose the capping/polishing stop layer, the substrate can be patterned and etched or selectively etched to remove the exposed portions of the capping/polishing stop layer and portions of an underlying second dummy structure. Gate dielectric and gate electrode materials can then be deposited within the opening and polished back to form a second gate electrode, similar to gate electrode 91 shown and described with respect to FIG. 10. These processing steps can subsequently be repeated to include different materials and thicknesses of gate dielectrics and gate electrodes in the formation of multiple transistors, thereby forming a number of transistors having different physical, operational, and performance characteristics.

In yet another embodiment, instead of forming the first dummy structure and then filling it with the first gate electrode material, the first gate electrode may be formed using the material used to form the dummy stack. For example, referring to FIG. 1, the dielectric layer 162 may be replaced by a first gate dielectric layer. The first gate dielectric layer can include high-k gate dielectric materials such as silicon nitride, titanium dioxide, tantalum pentoxide, or any other dielectric material or combination thereof suitable for use as a gate dielectric. The first gate electrode material can then be deposited, in place of the polysilicon layer 164, using metals, metal nitrides, or combinations of materials previously described for gate electrode material 64, in FIG. 6.

The antireflective layer 166, shown in FIG. 4, may then be formed over the gate electrode material. If however, a metal nitride is used as the gate electrode material, the antireflective nature of the metal nitride film may be such that the antireflective layer may not be necessary, thereby eliminating this processing step. Processing of the substrate continues to form a semiconductor device substrate similar to that shown in FIG. 4. The substrate is then polished, and the exposed dummy stack material and, optionally, the liner layer and the underlying dielectric layer are removed from the dummy structure to form the feature opening. The second gate dielectric layer and gate electrode material are then formed within the dummy structure opening 66, as illustrated in FIG. 6. In accordance with one embodiment of the present invention, the thickness and composition of the second gate dielectric and second gate electrode material can be the same or different from those of the first gate dielectric and first gate electrode material.

The substrate is then polished to form a structure similar to the one illustrated in FIG. 8. However, unlike FIG. 8, two gate electrodes are now formed instead of just one gate electrode and one dummy structure. In this manner, the second sequence of steps, as shown in FIGS. 9 and 10, can be eliminated. This reduces cycle time and potentially increases device yield as a result of fewer processing operations.

In yet another embodiment, dielectric spacers can be formed along sidewalls within either of the openings 86 or 66 prior to depositing the conductive electrode film 84 or 64. In this manner, the dimensions of the gate electrode can be reduced beyond the capabilities of the patterning and etching processes used to define the dimensions of the respective opening. This can be advantageous because the transistor can be fabricated with dimensions that are smaller than the size of the opening.

Embodiments of the present invention include several advantages over the prior art. Among them include the ability to perform threshold implants at alternative processing steps during the formation of the transistors. For example, referring to FIG. 1, threshold adjust implants for the N-channel and P-channel regions can initially be performed after forming the dielectric layer 162. Alternatively, the threshold adjust implants can be individually be performed after forming the respective feature openings in the dummy stacks. This provides added flexibility in that the P-channel transistor can be implanted to adjust its threshold voltage independent of the N-channel transistor. Similarly, the N-channel transistors can be implanted to adjust its threshold voltage independent of the P-channel transistor.

In addition, the process integration scheme allows for the combining of different metals and metal-containing gates for both NMOS and PMOS transistors. The work functions of the different materials can be selected such that the threshold voltages can be specifically matched to each of the NMOS and PMOS transistors. Furthermore, by repeating the selective removal of polish stop/capping layers with the conventional photolithography and RIE processes, different gate dielectric materials and thickness as well as different gate materials can be selected to form a various transistors with different threshold voltages and operating characteristics.

Use of elevated source and drain regions is not required. However, the elevated source and drain regions provide an advantage in that they reduce the overetch requirements for forming the openings that expose source and drain regions. In addition, the elevated source and drain regions also reduce the amount of etch induced damage to the metal gates because the depth of an opening to the metal gate now more closely approximates the depth of the opening to the source and drain regions. Additionally, unlike the prior art, embodiments of the present invention provide additional processing latitude in that they allow for silicidation of the source and drain regions either before or after the formation of the gate electrode.

Furthermore, embodiments of the present invention circumvent many of the problems currently associated with metal gate electrode technology. Because the metal gate is formed after the potentially damaging high-temperature source/drain anneal, the risk of damaging the metal gate electrode is reduced. Additionally, prior art metal gate processes generally result in non self-aligned source and drain regions. However, embodiments of the present invention can produce source and drain regions that are fully aligned to their subsequently formed gate electrodes. In addition, exposure of the interface between the metal gate electrode and the gate dielectric to high temperatures is also minimized. Therefore degradation of the gate oxide due to interactions with the metal is also reduced. Yet another advantage includes that the embodiments described herein can be performed without using marginal processing steps or unusual or exotic materials.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. Benefits, other advantages, and solutions to problems have been described with regard to specific embodiments. However, the benefits, advantages, solutions to problems, and any element(s) that may cause any benefit, advantage, or solution to occur or become more pronounced are not to be construed as a critical, required, or essential feature or element of any or all the claims.

What is claimed is:

1. A method for forming a semiconductor device comprising:
   forming first and second dummy structures over a semiconductor device substrate,
   forming source and drain regions, wherein alignment of source and drain regions is obtained using the first and second dummy structures;
   removing portions of the first dummy structure to form a first opening;
   filling the first opening with a first conductive material, wherein portions of the first conductive material form a first gate electrode;
   removing portions of the second dummy structure to form a second opening; and
   filling the second opening with a second conductive material, wherein portions of the second conductive material forms a second gate electrode, and wherein the first conductive material and the second conductive material are different conductive materials.

2. The method of claim 1, wherein the source and drain regions include elevated source and drain regions.

3. The method of claim 2, wherein the source and drain regions include silicided source and drain regions.

4. The method of claim 1 further comprising:
   forming a first gate dielectric between the first gate electrode and the semiconductor device substrate; and
   forming a second gate dielectric between the second gate electrode and the semiconductor device substrate, wherein a thickness of the first gate dielectric and a thickness of the second gate dielectric are different.

5. The method of claim 1, wherein at least one of the first dummy structure and the second dummy structure includes a material selected from a group consisting of amorphous silicon, polysilicon, germanium, and silicon germanium.

6. The method of claim 1, wherein at least one of the first conductive material and the second conductive material includes a metal selected from a group consisting of aluminum, copper, titanium, tantalum, tungsten, molybdenum, platinum, palladium, osmium, iridium, and ruthenium.

7. The method of claim 1, further comprising forming an interconnect layer and a passivation layer over the semiconductor device substrate.

8. The method of claim 1, further comprising:
   forming a dielectric layer overlying the first and second dummy structures;
   polishing the dielectric layer to expose portions of the first and second dummy structures;
   forming a first capping layer over the second dummy structure prior to removing portions of the first dummy structure; and
   forming a second capping layer over the first gate electrode prior to removing portions of the second dummy structure.

9. A method for forming a semiconductor device comprising:
   forming first and second dummy structures over a semiconductor device substrate;
   forming a dielectric layer overlying the first and second dummy structures;
   polishing the dielectric layer to expose a first portion of a stop material underlying a portion of the dielectric layer;
   removing portions of the first dummy structure to define a first opening;
   filling the first opening with a first conductive material;
   removing portions of the first conductive material to at least partially form a first gate electrode;
   removing surface portions of the semiconductor device substrate to expose a second portion of the stop material;
   removing portions of the second dummy structure to define a second opening;
   filling the second opening with a second conductive material, wherein the second conductive material is different from the first conductive material; and
   polishing the second conductive material to form a second gate electrode.

10. The method of claim 9, wherein the stop material includes portions of at least one of the first and second dummy structures.

11. The method of claim 9, wherein the stop material includes portions of a capping layer formed overlying the first and second dummy structures.

12. The method of claim 11, wherein the capping layer includes a material selected from a group consisting of silicon nitride, titanium oxide, tantalum oxide, aluminum oxide, zirconium oxide, germanium nitride, and aluminum nitride.

13. The method of claim 11, wherein removing portions of the first conductive material and removing surface portions are performed during a same polishing process.

14. A method for forming a semiconductor device comprising:
   forming first gate structures over a semiconductor device substrate, wherein the first
   gate structures include a first gate dielectric and a first gate electrode material;
   forming an insulating layer over the first gate structures;
   removing portions of the insulating layer;
   exposing portions of the first gate electrode material;
   removing portions of the first gate electrode material from at least one of the first gate structures to form an opening;
   filling the opening with a second gate electrode material; and polishing the second gate electrode material to form a second gate structure over the semiconductor device substrate, wherein the second gate structure operates at a threshold voltage that is different from the first gate structures.

15. The method of claim 14, further comprising:

removing portions of the first gate dielectric after removing portions of the first gate electrode material; and filling the opening with a second gate dielectric prior to filling the opening with a second gate electrode material.

16. The method of claim 15, wherein the first gate electrode material is different from the second gate electrode material.

\* \* \* \* \*